(12) United States Patent
Schreder et al.

(10) Patent No.: US 9,057,836 B2
(45) Date of Patent: Jun. 16, 2015

(54) INFRARED ABSORBING GLASS WAFER AND METHOD FOR PRODUCING SAME

(71) Applicant: Schott AG, Mainz (DE)

(72) Inventors: Bianca Schreder, Sulzbach (DE); Jochen Freund, Stadecken-Elsheim (DE); Ute Woelfel, Mainz-Laubersheim (DE); Claude Martin, Yverdon-les-Bains (CH); Christophe Baur, Gorier (CH); Steffen Reichesl, Mehlingen (DE); Marc Clement, Mainz (DE)

(73) Assignee: SCHOTT AG, Mainz (DE)

( * ) Notice: Subject to any disclaimer, the term of this patent is extended or adjusted under 35 U.S.C. 154(b) by 77 days.

(21) Appl. No.: 13/846,070

(22) Filed: Mar. 18, 2013

(65) Prior Publication Data

US 2013/0264672 A1    Oct. 10, 2013

(30) Foreign Application Priority Data

Apr. 10, 2012 (DE) .......... 10 2012 103 077

(51) Int. Cl.
| | |
|---|---|
| *H01L 21/203* | (2006.01) |
| *G02B 5/22* | (2006.01) |
| *G02B 5/20* | (2006.01) |
| *H01L 31/0216* | (2014.01) |
| *C03C 3/00* | (2006.01) |
| *H01L 27/146* | (2006.01) |

(52) U.S. Cl.
CPC ............. *G02B 5/226* (2013.01); *G02B 5/208* (2013.01); *H01L 31/0216* (2013.01); *C03C 3/00* (2013.01); *H01L 27/146* (2013.01); *H01L 27/14621* (2013.01)

(58) Field of Classification Search
CPC .................................................. H01L 21/0203
USPC .......................................................... 257/95
See application file for complete search history.

(56) References Cited

U.S. PATENT DOCUMENTS 6,252,702 B1 * 6/2001 Cook et al. ............. 359/356
2004/0082460 A1 * 4/2004 Yamane et al. ............. 501/48

FOREIGN PATENT DOCUMENTS

DE    102006032047    1/2008

OTHER PUBLICATIONS

Office Action dated Dec. 17, 2012 corresponding to German Patent Application No. 10 2012 103 077.4.

* cited by examiner

*Primary Examiner* — Julio Maldonado
*Assistant Examiner* — Mohammad Choudhry
(74) *Attorney, Agent, or Firm* — Ohlandt, Greeley, Ruggiero & Perle, LLP

(57) ABSTRACT

A glass wafer is provided that is made of a copper ions containing phosphate or fluorophosphate glass. The glass wafer has a diameter greater than 15 centimeters and a thickness of less than 0.4 millimeters. The glass wafer has two plane-parallel surfaces at least one of which is polished.

9 Claims, 4 Drawing Sheets

INFRARED ABSORBING GLASS WAFER AND METHOD FOR PRODUCING SAME

CROSS REFERENCE TO RELATED APPLICATIONS

This application claims benefit under 35 U.S.C. §119(a) of German Patent Application No. De 10 2012 103 077.4, filed Apr. 10, 2012, the entire contents of which are incorporated herein by reference.

BACKGROUND OF THE INVENTION

1. Field of the Invention

The invention generally relates to glass wafers. More particularly, the invention relates to glass wafers made of infrared absorbing glasses.

2. Description of Related Art

As is known, camera chips typically have the property that the pixels of the chip are sensitive also in the infrared spectral range. Moreover, the optical system of camera modules whose optical components are made from standard glasses or plastic materials generally exhibit a certain amount of infrared transmission. However, infrared light that reaches the chip results in undesirable color and brightness distortions.

For this reason, camera modules are typically equipped with infrared filters. The most common infrared filters are interference filters. For such filters, a multi-layered dielectric layer system is deposited on a substrate, typically a glass substrate. The multi-layered dielectric layer system, based on physical reasons, is designed to reflect infrared radiation, but to transmit visible light. Such filters are relatively inexpensive to produce, but have several drawbacks. Interference filters often impart a certain modulation to the transmission curve. This modulation has an effect similar to that of a comb filter and may affect individual colors.

Moreover, interference filters exhibit a much stronger dependency of the filter curve (transmission curve) from the light incident angle than optical filter glass which is also referred to as "colored glass" or as absorption filter. Compact cameras typically have a full opening angle of up to 30° and often are not telecentrically aligned, i.e. the light rays impinge to the image sensor at a certain angle (with the full opening angle).

Additionally, the infrared light is reflected back by the interference layer into the optical system. Since the interference filter generally still exhibits a residual transmission at least in the near infrared range, very annoying ghost images may occur in the optical system due to multiple reflections.

An alternative thereto is provided by infrared filters in form of filter glasses. A filter glass, by virtue of its character neither exhibits the aforementioned comb filter effect nor ghost images due to multiple reflected infrared light, since the infrared light is absorbed when passing through the glass.

However, heretofore, their cost-efficient manufacturing is not the only advantage of interference filters when compared to filter glasses. The interference layers are very thin and can be deposited on very thin substrates. This has so far allowed to produce more compact optical systems using interference filters.

SUMMARY

Therefore, an object of the invention is to simplify the manufacturing of optical systems that include filter glasses as an infrared filter, and to make it cheaper and at the same time to reduce the space required by the filter glass.

Accordingly, the invention provides a glass wafer made of a copper ions (Cu ions) containing fluorophosphate or phosphate glass. Such copper ions containing glasses for absorption of infrared light are also referred to as blue glasses. The glass wafer has a diameter greater than 15 centimeters. The thickness of the glass wafer is smaller than 0.4 millimeters. At least one of the surfaces of the glass wafer is polished. Height modulations of the surfaces of the glass wafer in form of waves are limited to a height of less than 200 nanometers, preferably less than 130 nanometers, based on a length of not more than 1 millimeter. Waves having a width smaller than the above-mentioned relevant scale of 1 millimeter are particularly effective with respect to the optical resolution of camera sensors. Relevant herein is the wavelength, or an average period of the waves within a length range from 0.1 to 1 millimeter.

Additionally, according to one embodiment of the invention, the variation in thickness of the glass wafer is smaller than ±50 µm, based on a surface area of 5×5 mm, or 25 mm². This slight variation in thickness is advantageous to ensure that the filter curve (transmission curve) remains approximately constant (i.e. varies only slightly). Also this feature of the glass wafer can be achieved by the inventive production method as described below.

Preferably, the thickness of the glass wafer ranges between 0.18 millimeters and 0.32 millimeters, more preferably from not less than 0.2 millimeters to not more than 0.3 millimeters. According to one exemplary embodiment, the glass wafer has a diameter of 8 inches and a thickness of 0.30 mm.

According to another embodiment, the thickness of the glass wafer ranges from 0.08 to 0.15 millimeters, and in particular is about 0.1 millimeters.

Of course, the aforementioned thickness data do not mean that the thickness of the glass wafer varies between the indicated values. Rather, the glass wafer is of plane-parallel shape, and the uniform thickness of the glass wafer is in a range of the above mentioned values.

Typically, the infrared filters made from the glass wafer are mounted near the camera chip. In order to avoid shadowing effects on the camera chip, the glass wafer preferably has no bubbles and/or inclusions which are larger than 100 nm or larger than 200 nm. Therefore, shadowing effects are virtually negligible, even with small pixels of the camera sensor with pixel sizes down to about 1 µm.

The glass wafer according to the invention absorbs in the infrared range, due to the copper ions contained.

The wafer is very thin, having a thickness of less than 0.4 millimeters, and therefore it is well suited especially for the very compact optical systems of small cameras such as incorporated in cell phones.

However, a problem usually arising with thin glasses is a ripple of the glass surface and the uniformity of the glass thickness. According to the invention, this problem is solved by thinning the wafer by an abrasive process from a thicker glass substrate to the thickness of less than 0.4 millimeters. The abrasive process comprises polishing as a sole or in particular as a final step to obtain an appropriate surface.

Specifically, a method for manufacturing the glass wafer is provided, which comprises the steps of: producing a glass sheet of a copper ions containing phosphate or fluorophosphate glass, the glass sheet having a thickness of at least 1.8 millimeters; removing glass material in an abrasive process, until the glass sheet or the wafer previously produced from the glass sheet has a thickness of not more than 0.4 millimeters, the abrasive process at least comprising polishing the glass sheet or the wafer already produced from the glass sheet. The producing of the wafer from the glass sheet in particular comprises working out the wafer from the glass sheet with its intended outline shape. The working out may for example be accomplished by cutting, sawing, or even grinding, such as by ultrasonic vibration grinding.

According to an alternative of the method, if the glass sheet at the end of the abrasive process still does not possess the final outline shape of the wafer, the wafer is then worked out from the glass sheet following the abrasive process.

According to the thicknesses indicated above, for manufacturing the wafer the glass is thinned by at least a factor of 4.5 by polishing, or by grinding followed by polishing. The method may seem to be complicated at first glance, but in this way a high plane-parallelism of the glass wafer and especially a low curvature (also referred to as "warpage") can be achieved.

This now allows to join the wafer with a functional wafer having camera chips disposed thereon, or with optoelectronic array sensors, and then to separate the chips to produce camera modules. Accordingly, the invention also relates to a wafer assembly comprising a glass wafer according to the invention and an optoelectronic functional wafer, or an assembly of a semiconductor wafer having a plurality of optoelectronic array sensors for producing camera modules thereon and a glass wafer according to the invention joint to the semiconductor wafer. The two wafers do not necessarily have to be joint directly. Rather, one or more intermediate layers may be provided between the two wafers. For example, a layer or a wafer with microlenses may be provided between the infrared absorbing glass wafer according to the invention and the functional wafer.

DESCRIPTION OF THE DRAWINGS

The invention will now be described in more detail by way of exemplary embodiments and with reference to the accompanying figures. In the figures, the same reference numerals designate the same or corresponding elements. In the figures.

DETAILED DESCRIPTION

Figure 1:
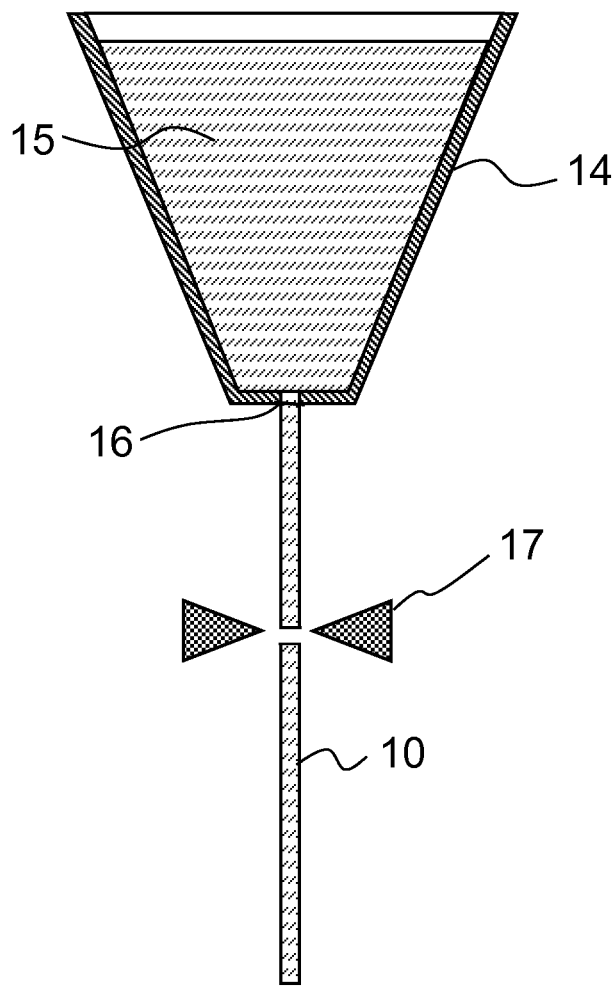
FIG. 1, FIG. 2, and FIG. 3 illustrate the manufacturing of a glass wafer according to the invention.
Figure 2:
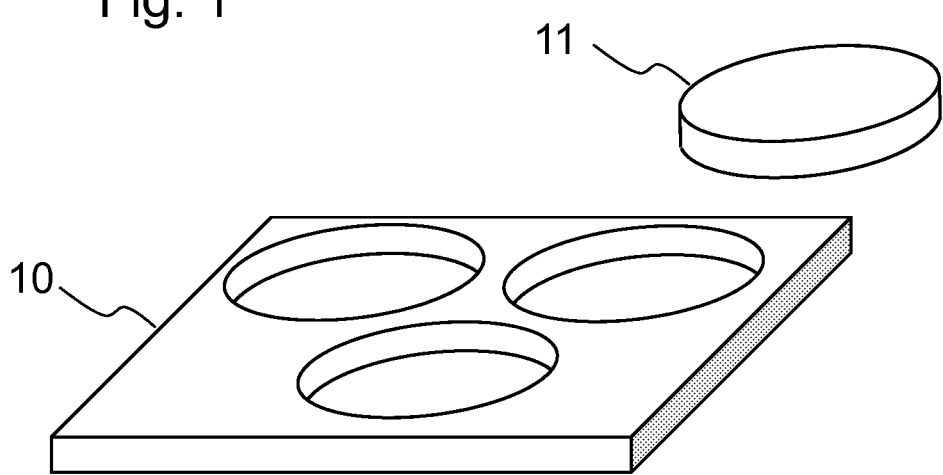
Figure 3:
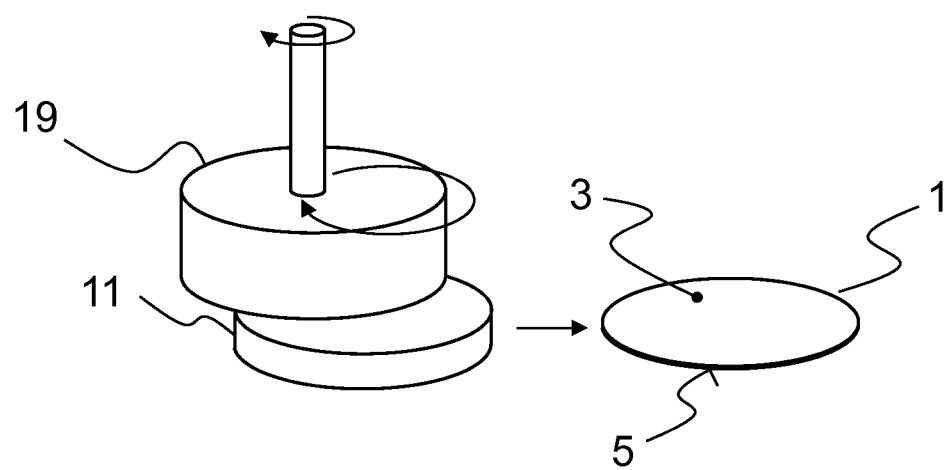

Referring to FIGS. 1, 2, and 3, the manufacturing of a glass wafer according to the invention will be described schematically. First, the molten glass from which the glass sheet is produced, is prepared by a preferably continuous melting process. FIG. 1 shows a crucible 14 having a slotted nozzle at its bottom. The crucible may be formed by the melting trough itself, or the fluorophosphate or phosphate glass melt 15 produced in the melting trough is filled into crucible 14. A strip of glass exiting from slotted nozzle 16 is separated into individual glass sheets 10 using a cutting tool 17. Accordingly, in this exemplary embodiment the glass sheets are manufactured in a so-called downdraw process. Alternatively, however, other processes are likewise possible, such as a float process or overflow fusion process.

The thus produced glass sheets 10 have a thickness of at least 1.8 millimeters, preferably from 1.8 to 3.2 millimeters, more preferably a thickness in a range from 2 to 3 millimeters. With these glass thicknesses, a planar surface and a comparatively uniform thickness is achieved. On the other hand, with glass thicknesses of not more than 3 millimeters, the amount of glass material to be ablated to obtain the intended final thickness is limited.

Subsequently, as shown in FIG. 2, wafer-shaped glass sheets 11 are cut out of glass sheet 10.

Then, as shown in FIG. 3, these glass sheets 11 are ground down and polished, from the original thickness of at least 1.8 millimeters to a thickness of less than 0.4 millimeters, using one or more ablation tools 19. Accordingly, the glass wafer 1 so produced has at least one polished surface 3. Preferably, glass material is removed from both sides, so that the two opposite surfaces 3, 5 of glass wafer 1 are polished. For polishing, a polishing plate may be used, for example, and a suitable abrasive agent, such as a cerium oxide slurry.

In the exemplary embodiment schematically illustrated in FIGS. 1 to 3, the glass wafer 1 is cut out of the glass sheet 10 prior to polishing. This is advantageous in order to reduce the amount of material to be removed. However, it is likewise possible to perform some ablation steps prior to cutting. Furthermore, it is also possible to cut out a preform, to thin the glass to the intended thickness, and then to cut out the final shape of the wafer. This may be advantageous in terms of avoiding any inhomogeneities at the edge of glass wafer 1 that might be caused by the ablation process.

Generally, cutting out the wafer prior to the abrasive removal of material is advantageous, since the oddments may be recycled as fragments for the manufacturing of glass, thus protecting resources (environmental, costs, raw material).

Preferably, the glass sheets are made to have as few streaks as possible. Streaks, also referred to as schlieren in the art, cause inhomogeneities in the refractive index. However, to a certain degree such schlieren do not significantly affect the optical properties of the camera module when the infrared filter produced from glass wafer 1 is positioned close to the sensor. This arrangement, in principle, is a common arrangement for camera modules.

However, there is another effect that may adversely affect the optical properties. The schlieren represent local chemical and/or mechanical changes in the glass. These modifications are generally accompanied by an alteration in strength. In the grinding process, this may cause that the schlieren are reflected in unevennesses during polishing of the glass. The effect of the schlieren on the optical path of light passing through the volume of the glass is relatively small due to the only small local change of the refractive index.

However, on the surface of the glass this turns out to be different. If schlieren are produced at the surface, these will lead to local variations in thickness, which now cause a significant effect on the beam path and may adversely affect the resolution of the camera module, since waves on the glass surface produced at the schlieren during polishing will act like lenses.

Therefore, in an wafer according to the invention, surface modulations caused by internal glass schlieren are smaller than 200 nm, more preferably smaller than 130 nm.

However, the use of a phosphate or fluorophosphate glass according to the invention in combination with the abrasive removal allows to avoid this effect and at the same time permits to produce a very thin, large area glass wafer 1 of a homogenous thickness.

Additionally, bubbles and/or inclusions in the glass should be smaller than 200 nm, more preferably smaller than 100 nm in order to ensure a good image quality of the camera chip by avoiding shadowing effects.

Copper containing phosphate or fluorophosphate glasses of a chemical composition comprising the following components (wt. % based on oxide) have been found suitable for the invention:

$P_2O_5$: 25-80;

$Al_2O_3$: 1-13;

$B_2O_3$: 0-3;

$Li_2O$: 0-13;

$Na_2O$: 0-10;

$K_2O$: 0-11;

CaO: 0-16;

BaO: 0-26;

SrO: 0-16;

MgO: 1-10;

ZnO: 0-10;

CuO: 1-7.

In deviating from the composition given above, not all oxides of the alkaline earth oxides listed above need to be contained. Preferably, however, at least two of alkaline earth oxides CaO, BaO, SrO, and MgO are used in the glass composition.

According to one embodiment, the following fluorophosphate glasses are preferred, with a chemical composition comprising the following components (in wt. % based on oxide):

$P_2O_5$: 25-60;

$Al_2O_3$: 1-13;

$Li_2O$: 0-13;

$Na_2O$: 0-10;

$K_2O$: 0-11;

MgO: 1-10;

CaO: 1-16;

BaO: 1-26;

SrO: 0-16;

ZnO: 0-10;

CuO: 1-7;

$\Sigma RO$ (R=Mg, Ca, Sr, Ba) 15-40;

$\Sigma R_2O$ (R=Li, Na, K) 3-18;

wherein starting from this composition, 1 to 39 mol % of the oxide ions ($O^{2-}$) in the glass are replaced by fluoride ions (F).

$As_2O_3$ is optional, as a refining agent. When using $As_2O_3$, the content thereof is preferably up to 0.02 weight percent.

Since it has been found that fluorine contained in the glass is useful in terms of corrosion resistance and weather resistance, fluorophosphate glasses are preferred according to one embodiment of the invention.

Figure 4:
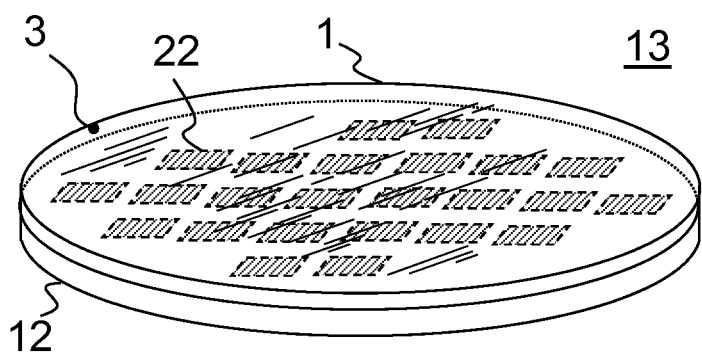
FIG. 4 shows a wafer assembly comprising a semiconductor wafer and an infrared absorbing glass wafer.

The thin glass wafer 1 produced according to the invention now furthermore enables to produce camera modules or at least camera sensors which include an infrared filter at wafer level. FIG. 4 shows a wafer assembly 13 comprising a glass wafer 1 according to the invention and a semiconductor wafer 12 having a plurality of camera sensors 22 thereon, wherein glass wafer 1 is bounded to semiconductor wafer 12 on the side of semiconductor wafer 12 on which the camera sensors 22 are arranged. Semiconductor wafer 12 also has a diameter of more than 15 cm, like glass wafer 1.

Since by removing glass material in an abrasive process, large glass wafers 1 can be produced, it is also possible to use correspondingly large semiconductor wafers 12 with a correspondingly large number of camera sensors 22 arranged thereon. The individual camera chips with camera sensors 22 may then be separated from the wafer assembly 13 by dicing or sawing.

Figure 5:
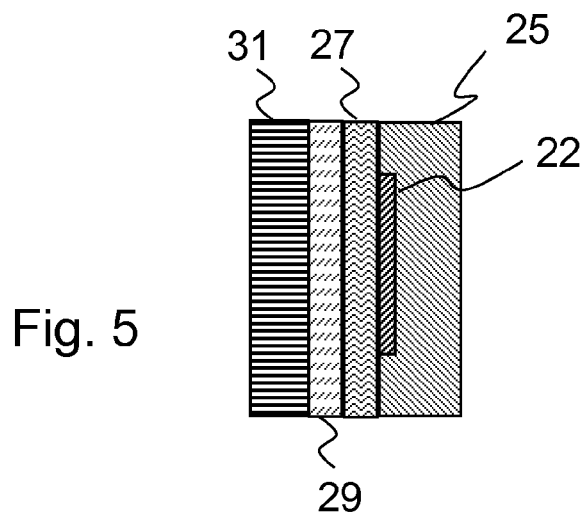
FIG. 5 shows a camera chip including an infrared filter.

As already mentioned above, glass wafer 1 does not need to be bonded directly to semiconductor wafer 12 in the wafer assembly, rather, further wafers or intermediate layers may be interposed. FIG. 5 illustrates an exemplary embodiment of a camera chip having optical functional layers, such as obtainable by separation from the wafer assembly 13. In the illustrated example, a window 27 with microlenses is applied upon camera chip 25 on the side thereof on which the optoelectronic array sensor 22 is arranged. Upon this window 27, the infrared filter 29 made from glass wafer 1 is disposed.

Finally, advantageously, an optical low-pass filter 31 is used. In the example shown in FIG. 5, this optical low-pass filter 31 is mounted to infrared filter 29. Optical low-pass filter 31 serves to avoid moiré patterns in the captured images, which occur when recording periodic structures whose periodicity corresponds to the pixel pitch. Low-pass filter 31 may also be attached to glass wafer 1 of wafer assembly 13 in form of a wafer and may then be separated together with camera chip 25 and infrared filter 27 by being cut from the wafer assembly 13.

Figure 6:
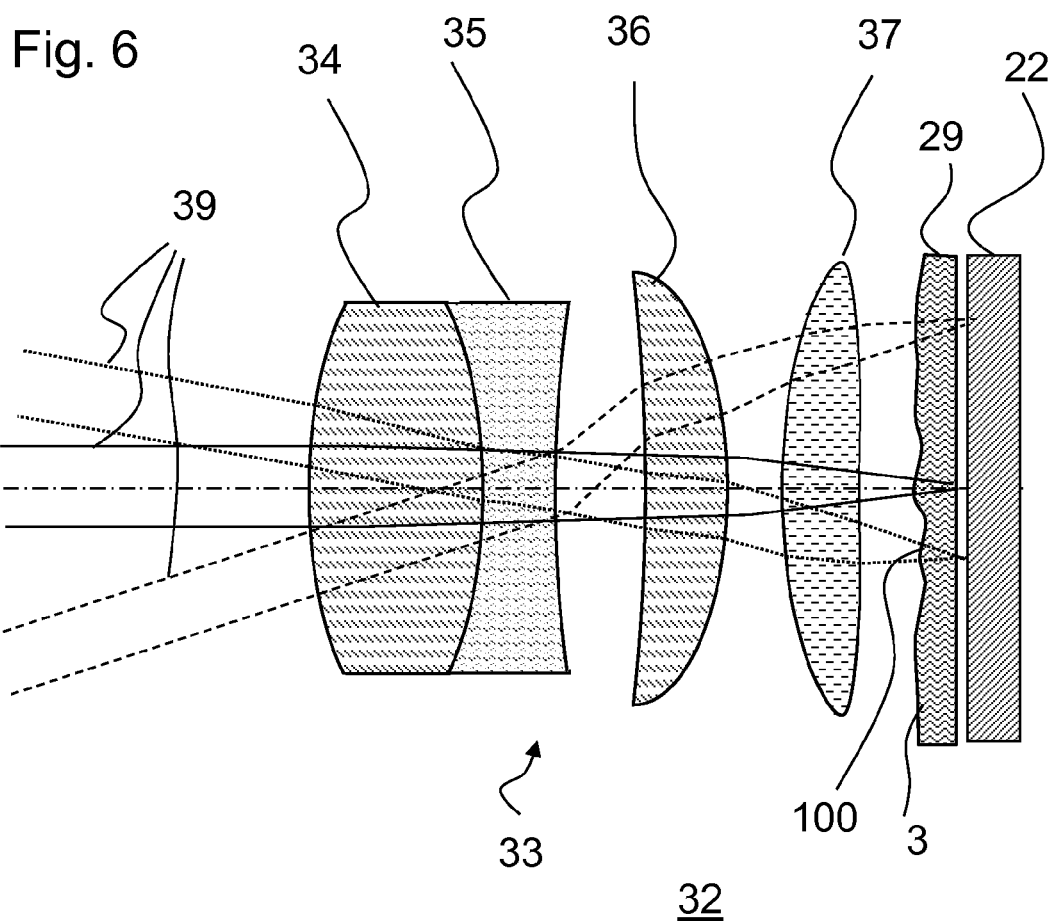
FIG. 6 shows a camera module with an infrared filter.

It will now be illustrated by way of an exemplary embodiment how schlieren and also corresponding surface deformations of an infrared filter may affect the resolution of a camera module. For this purpose, FIG. 6 shows a camera module 32 comprising an objective lens 33 which focuses incident beams of rays 39 onto optoelectronic array sensor 22 by means of lenses 34, 35, 36, 37.

Since schlieren existing in the glass of infrared filter 29 will cause a difference of the optical paths due to local variations of the refractive index, the effect of schlieren may be simulated by a deformation of the surface of infrared filter 29, which causes a corresponding path difference. For illustration purposes, surface 3 of infrared filter 29 cut from glass wafer 1 is shown as being wavy. Of course, for the purpose of illustration, the height of waves 100 is exaggerated.

Waves 100 on the surface, which have been imparted by schlieren, locally cause an additional negative or positive refractive power. In both cases, a result thereof is that the respective beam of rays is no longer focused exactly onto the light sensitive surface of array sensor 22. Accordingly, there will be a loss in maximum possible spatial resolution. This negative effect is avoided or at least alleviated by using an infrared filter made from a glass wafer 1 according to the invention, which is produced by mechanically thinning a low schlieren phosphate glass, preferably fluorophosphate glass. The surface modulation caused by waves 100 resulting from schlieren is smaller than 200 nanometers, preferably smaller than 130 nanometers. This height indication represents a peak-to-valley value. The relevant surface scale for the waves is a length range of up to 1 millimeter, typically a length range from 0.1 to 1 millimeter. In other words, we speak of wave structures having an average periodicity or width transversely to the longitudinal direction of the waves of not more than 1 millimeter.

In addition, preferably, the thickness variation of glass wafer 1 is less than 50 μm, based on a surface area of 25 mm$^2$, so that the transmission curve remains approximately constant.

Figure 7:
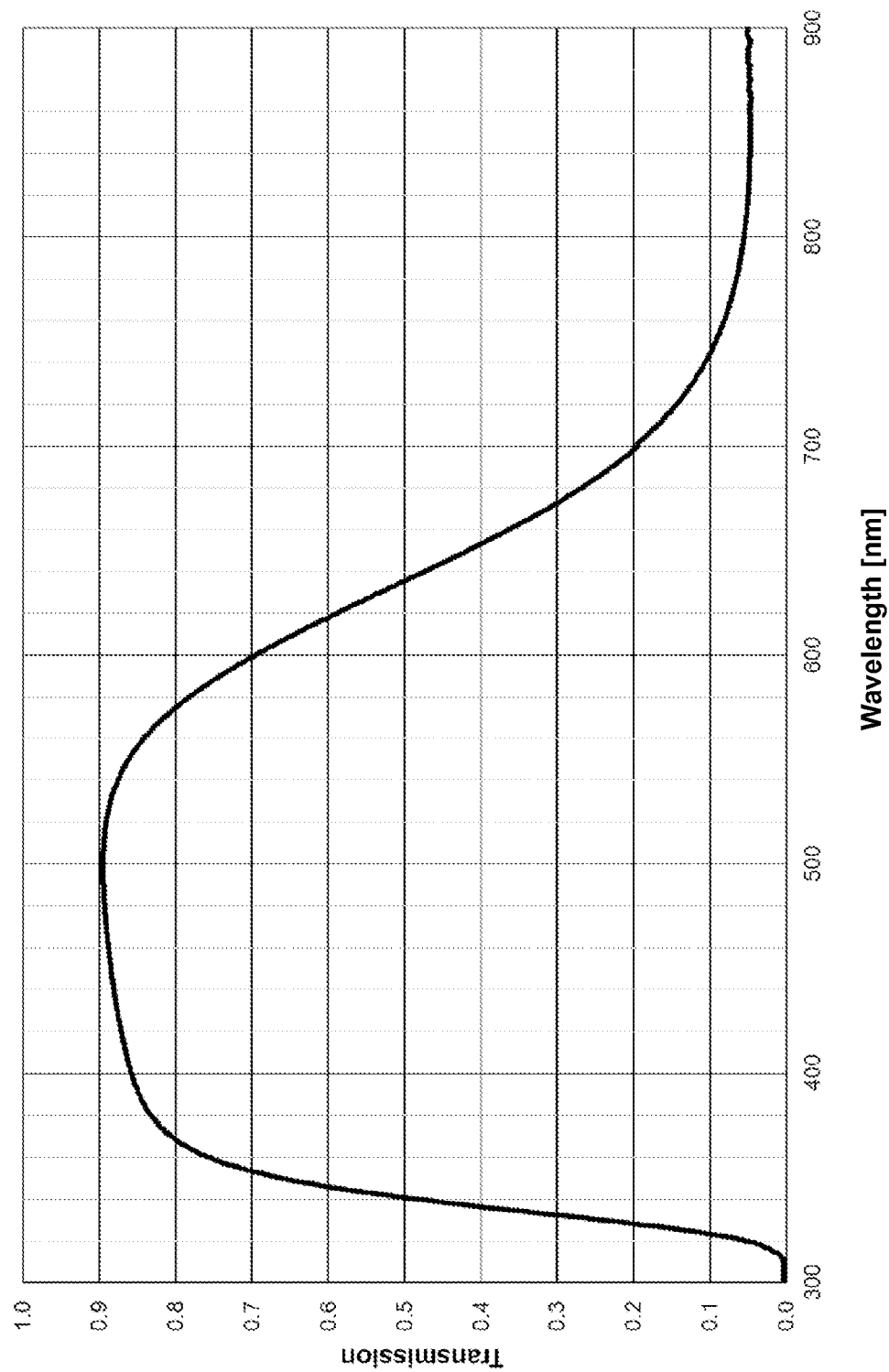
FIG. 7 shows a transmission curve of an infrared absorbing glass wafer having a thickness of 0.3 mm.

FIG. 7 shows, as an exemplary embodiment, a transmission curve of a copper ions containing fluorophosphate glass (in this case a glass marketed under the trade name BG60 of SCHOTT AG and having a thickness of 0.3 mm), such as it may be used for the invention. As is apparent from the curve, the transmission of the glass significantly decreases at wavelengths above the maximum red sensitivity of the human eye at 560 nanometers, due to an absorption of the copper ions. In the visible spectral range at shorter wavelengths, transmission is relatively constant. If a higher copper content is selected, the drop of transmission at wavelengths above 560 nanometers will be even steeper.

It will be apparent to those skilled in the art that the invention is not limited to the exemplary embodiments illustrated in the figures but may be varied in various ways within the scope of the appended claims. For example, glass wafer 1 may have further layers. For example, an optical anti-reflection coating is possible, and/or a combination with an additional dielectric interference layer system for reflecting infrared components.

LIST OF REFERENCE NUMERALS

1 Glass wafer
3, 5 Surfaces of glass wafer
10 Glass sheet
11 Wafer-shaped glass sheet
12 Semiconductor wafer
13 Wafer assembly
14 Crucible
15 Glass melt
16 Slotted nozzle
17 Separating tool
19 Ablation tool
22 Camera sensor
25 Camera chip
27 Window with microlenses
29 Infrared filter
31 Optical low-pass filter
32 Camera module
33 Objective lens
34, 35, 36, 37 Lenses of 33
39 Beam of rays
100 Waves on surface of 1

What is claimed is:

1. A glass wafer comprising:
a copper ions containing phosphate or fluorophosphate glass;
a diameter greater than 15 centimeters and a thickness of less than 0.4 millimeters; and
two plane-parallel surfaces, at least one of the two plane-parallel surfaces being polished, wherein the two plane-parallel surfaces have height modulations in form of waves with a height of less than 200 nanometers based on a length of not more than 1 millimeter.

2. The glass wafer as claimed in claim 1, wherein the height is less than 130 nanometers.

3. The glass wafer as claimed in claim 1, wherein the thickness varies by less than ±50 μm based on a surface area of 25 mm$^2$.

4. The glass wafer as claimed in claim 3, wherein the thickness ranges between 0.18 millimeters and 0.32 millimeters.

5. The glass wafer as claimed in claim 1, further comprising bubbles and inclusions that are no larger than 200 nm.

6. The glass wafer as claimed in claim 1, wherein the bubbles and inclusions that are no larger than 100 nm.

7. The glass wafer as claimed in claim 1, comprising a composition, in weight percent, based on oxide of:

$P_2O_5$: 25-80;

$Al_2O_3$: 1-13;

$B_2O_3$: 0-3;

$Li_2O$: 0-13;

$Na_2O$: 0-10;

$K_2O$: 0-11;

MgO: 1-10;

CaO: 0-16;

BaO: 0-26;

SrO: 0-16;

ZnO: 0-10; and

CuO: 1-7.

8. The glass wafer as claimed in claim 1, comprising a composition, in weight percent, based on oxide of:

$P_2O_5$: 25-60;

$Al_2O_3$: 1-13;

$Li_2O$: 0-13;

$Na_2O$: 0-10;

$K_2O$: 0-11;

MgO: 1-10;

CaO: 1-16;

BaO: 1-26;

SrO: 0-16;

ZnO: 0-10;

CuO: 1-7;

ΣRO (R=Mg, Ca, Sr, Ba) 15-40; and

Σ$R_2O$ (R=Li, Na, K) 3-18;

wherein starting from the composition, 1 to 39 mol % of the oxide ions ($O^{2-}$) in the glass are replaced by fluoride ions (F).

9. An assembly comprising:
a glass wafer of a copper ions containing phosphate or fluorophosphate glass, the glass wafer having a diameter greater than 15 centimeters and a thickness of less than 0.4 millimeters, the glass wafer having two plane-parallel surfaces at least one of which is polished, the two plane-parallel surfaces having height modulations in form of waves with a height of less than 200 nanometers based on a length of not more than 1 millimeter; and a semiconductor wafer with a plurality of optoelectronic array sensors for manufacturing camera modules, the glass wafer being bound to the semiconductor wafer.

* * * * *